United States Patent [19]

Chapple, III

[11] 4,336,525

[45] Jun. 22, 1982

[54] DIRECT CONVERSION ANALOG TO DIGITAL CONVERTER

[75] Inventor: William E. Chapple, III, Hartselle, Ala.

[73] Assignee: The United States of America as represented by the Secretary of the Army, Washington, D.C.

[21] Appl. No.: 137,651

[22] Filed: Apr. 7, 1980

[51] Int. Cl.[3] ...................... H03K 13/02; H03K 13/09

[52] U.S. Cl. ............................................ 340/347 AD

[58] Field of Search .................... 340/347 M, 347 AD

[56] References Cited

U.S. PATENT DOCUMENTS

| | | | |
|---|---|---|---|
| 2,733,432 | 1/1956 | Breckman | 340/347 AD |
| 2,950,469 | 8/1960 | Raasch | 340/347 AD |
| 3,119,105 | 1/1964 | Jepperson | 340/347 AD |
| 3,188,624 | 6/1965 | McMillian | 340/347 AD |
| 3,329,950 | 7/1967 | Shafer | 340/347 AD |
| 4,121,055 | 10/1978 | Doherty | 370/113 |
| 4,185,275 | 1/1980 | Carbrey | 340/347 AD |

OTHER PUBLICATIONS

National Semiconductor Corp. publication Quad SPST JFET Analog Switches, 1976, pp. 1-10.

The Engineering Staff of Analog Devices, Inc., Analog-Digital Conversion Handbook, 6/1972, pp. II-10, 11; III-1 to 11.

Schmid, Electronic Analog/Digital Conversions, Van Nostrand Reinhold Co., 1970, pp. 298-327.

*Primary Examiner*—Thomas J. Sloyan

*Attorney, Agent, or Firm*—Nathan Edelberg; Robert P. Gibson; Freddie M. Bush

[57] ABSTRACT

A four bit subtractor analog to digital converter provides direct conversion of analog voltage signals into binary or binary coded decimal output signals for digital display or digital signal processing. The analog to digital converter utilizes a plurality of signal processing sections, each section being designed to provide a binary output with the composite output bits being indicative of the analog input signal. In processing the analog signal an operational amplifier compares the input analog signal with a reference voltage in each section. Each section either passes or rejects the analog signal input in response to this comparison voltage. If the signal is rejected by a section it is passed to the next section where the same type of comparison takes place, if the signal is accepted by the operational amplifier and operated on, a comparator responsive to the amplifier output changes state providing a binary one output instead of a binary zero. A change in the comparator output signal to a binary one causes a field effect transistor switch to change states thereby supplying the operational amplifier output signal to subsequent signal processing sections instead of the originally supplied analog signal input. Subsequent sections operate in an identical manner with a systematic reduction in the comparison or reference voltage for providing digital signal processing. An amplifier at the end of each signal processing stage operates on the residual analog signal input to that amplifier to prepare the signal for processing in subsequent stages and thereby maintain signal integrity with no loss of signal level.

1 Claim, 2 Drawing Figures

DIRECT CONVERSION ANALOG TO DIGITAL CONVERTER

DEDICATORY CLAUSE

The invention described herein may be manufactured, used, and licensed by or for the Government for governmental purposes without payment to me of any royalties thereon.

BACKGROUND OF THE INVENTION

Traditional methods of providing analog to digital conversion is accomplished using counters, clocks, latches, or integrators. Typically a previous method uses frequency counters feeding digital to analog (DA) converters with the counters counting up or down until the output of the DA converter equals the original analog voltage. A second method uses the integrator technique with counters counting until the integrator voltage equals the unknown input voltage. For both of these methods the digital outputs are obtained from the outputs of counters.

SUMMARY OF THE INVENTION

A direct conversion analog to digital converter is provided by using subtractors, comparators, and field effect transistor switches. The converter directly converts analog voltages to digital logic voltages with simple, direct circuitry and can provide the output as a binary or binary coded decimal (BCD) output. An input voltage signal is supplied and operated on in sequence by successive stages of the converter, each stage responding to the particular input signal according to established bias for the particular stage, which determines the digital output of that stage.

DESCRIPTION OF THE PREFERRED EMBODIMENT

Figures 1, 2:
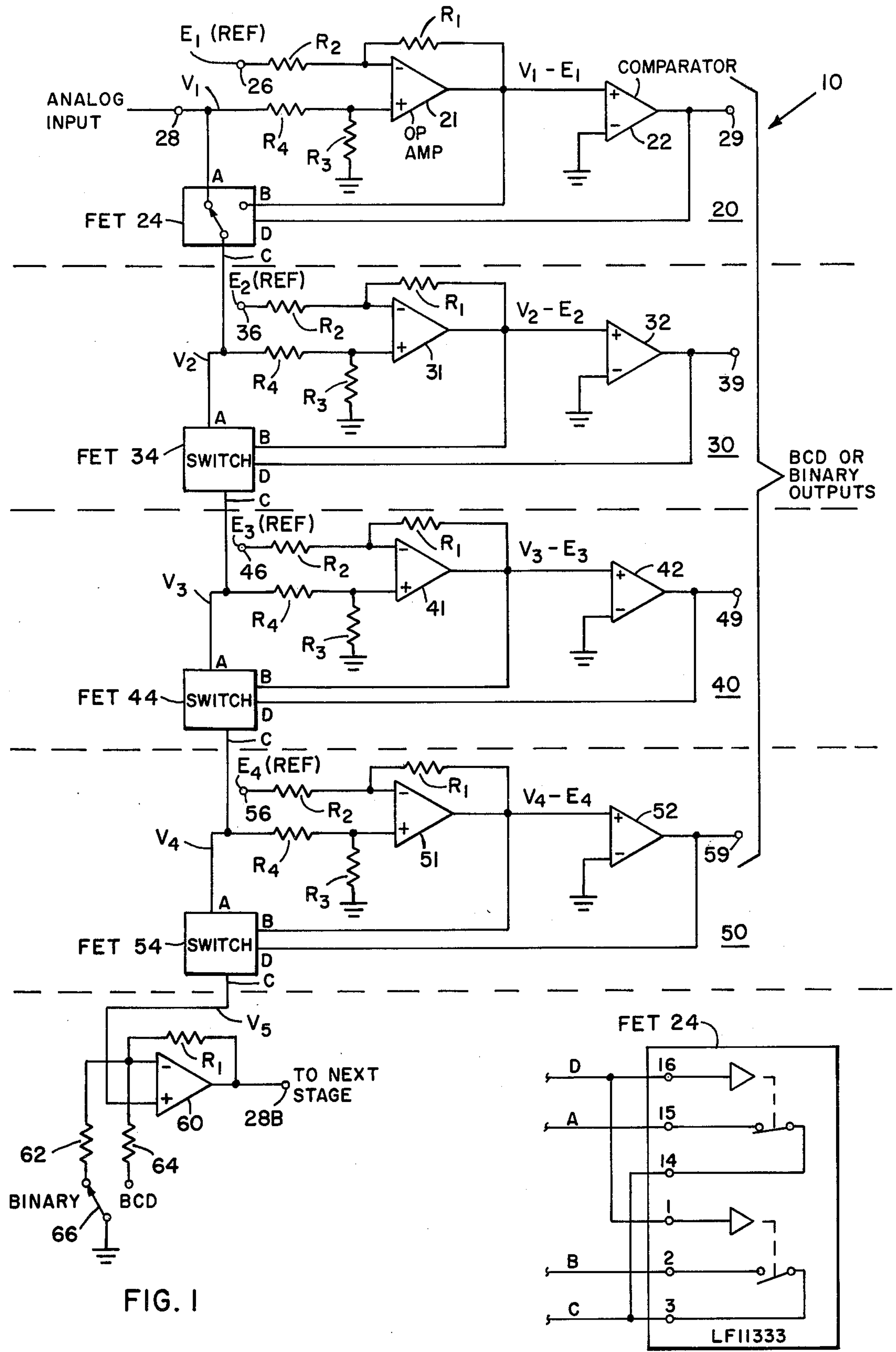
FIG. 1 is a schematic diagram of a preferred embodiment of the invention.
FIG. 2 is a schematic diagram of a typical field effect transistor switch for providing the switching function in FIG. 1.

Referring now to the drawings wherein like numbers represent like parts in each figure, FIG. 1 discloses a preferred embodiment of a four bit subtractor analog to digital converter for providing direct conversion. Analog to digital converter 10 is shown typically as comprising separate section 20, 30, 40 and 50 for providing a four bit binary or binary coded decimal (BCD) output. Sections 20–50 are substantially identical responding only to different voltage input levels according to preset biasing. Section 20 comprises an operational amplifier 21, a comparator 22 and a field effect transistor (FET) switch 24. Resistors R1, R2, R3, and R4 are identical in value and function with operational amplifier 21 to provide a subtractor circuit. R1 provides a feedback path from the output of amplifier 21 to the negative input, R2 is coupled to an input terminal 26 and the negative input of amplifier 21 for providing a comparison or biased voltage input thereto. R3 is coupled between the system ground and the positive input of amplifier 21, and R4 is coupled between the positive input of the amplifier and an input terminal 28. Input terminal 28 is adapted for receiving input analog signals for processing by the analog to digital converter. The field effect transistor switch 24 operates as a single pole-double throw switch and is shown schematically as having terminals A, B and C with terminal C being connected to the switch blade and terminal positions A–C representing one switch position and terminal positions B–C representing another switch position. Terminal A is connected to terminal 28 for selectively providing a path through switch 24 to subsequent sections 30, 40 and 50 for the input signal. Terminal B of switch 24 is connected to the output of operational amplifier 21 for selectively coupling output signals from the operational amplifier to the subsequent sections of the converter. Comparator 22 has a positive input coupled to the output of operational amplifier 21 and a negative input coupled to ground for providing a positive or negative output to an output terminal 29 which is indicative of the high-low or 1-0 output of the section. The output of comparator 22 is further fed back to FET 24 at input D for controlling the position or state of the switch. Sections 30, 40 and 50 are substantially the same in structure as section 20. In these sections resistances R1, R2, R3, and R4 provide the same functions as the resistances in section 20 and have the same numerical value. Operational amplifier 31 receives a bias input from terminal 36 and a signal input from the output of FET 24 through resistor R4 to the positive input of operational amplifier 31. The output of amplifier 31 is coupled as the positive input to a comparator 32 and provides a signal to the B input of FET switch 34. The A terminal of FET 34 is also coupled to the C terminal or output of FET 24. The output signal from comparator 32 is coupled to terminal 39 of section 30 and to switch FET 34. Similarly elements 41, 42 and 44 of section 40 operate in response to the input signal received from FET 34 to provide a binary output at terminal 49 and to supply the remainder signal to FET 44 and section 50. Section 50 responds in like manner with operational amplifier 51, comparator 52 and FET 54 responding to any output signal from FET switch 44 to provide an appropriate binary output at terminal 59 and couple any remainder signal to a following stage.

Depending on the degree of signal processing desired, processing may be terminated at this point with outputs from terminals 29, 39, 49 and 59 being coupled to provide the binary or BCD output signal indicative of the analog voltage supplied thereto. If additional resolution of the input signal is desired an operational amplifier 60 is shown having the positive input coupled to receive the output from FET 54, with the output signal from amplifier 60 being coupled to an output terminal 28B. A feedback path is provided from the output of amplifier 60 through resistance R1 to the negative input of the amplifier. The negative input of amplifier 60 is further coupled through resistances 62 and 64 to a selector switch 66. Selector switch 66 is coupled to ground and is switchable between resistors 62 and 64 to change the input bias signal coupled to the negative input of operational amplifier 60 for selecting binary or binary coded decimal signal processing for a subsequent stage. Typically with switch 66 coupling ground to resistor 62, amplifier 60 provides a voltage amplification of 16 times the input signal for preparing the input signal for subsequent analog to digital processing to provide a binary output signal. Similarly with switch 66 coupled to resistor 64 amplification of amplifier 60 is 10 times the input voltage signal for preparing the input signal for subsequent processing to provide a BCD output. Terminal 28B which is the output of amplifier 60 may be considered typically as the input to a subsequent four bit subtractor analog to digital converter stage identical to sections 20, 30, 40 and 50 which are responsive to inputs signals at terminal 28.

FIG. 2 shows a typical FET switching circuit for providing the switching functions of FET switches 24, 34, 44, and 54. Typically, FET 24 comprises first and second field effect transistors coupled to receive a gating or logic input D from the output of the comparator. The normally closed switch path of the first field effect transistor is coupled between input A and output C. The normally opened switch path of the second field effect transistor is coupled between input B and output C. This state is maintained when the respective sections comparator outputs are logical zero. When a logic 1 output is coupled to terminal D, the switches change position, coupling the output from the operational amplifier through the FET.

In operation, the input voltage at terminal 28 ($V_1$) is applied to terminal A of FET switch 24 and to one input of subtractor amplifier 21. A voltage reference $E_{1R}$ signal such as an 8 volt reference is applied to the negative input of amplifier 21. The difference of the two signals appears at the output of amplifier 21, at point B of FET switch 24, and at the input of comparator 22. For $V_1$ less than $E_{1R}$ switch 24 remains in position A and $V_1$ is applied to the second stage amplifier 31. A logic 0 is present on the output terminal 29 for this condition. If $V_1$ is greater than $E_1$ switch 24 is switched to position B, changing the voltage coupled to the second stage, the changed voltage being $V_1-E_{1R}$. Comparator 22 goes high causing a logic 1 to appear on output terminal 29.

Operation of the second section 30 is similar to the first. The voltage $V_2(V_2=V_1-E_{1R})$ applied through FET switch 24 has reference voltage $E_{2R}$ subtracted from it on the output of amplifier 31. If the voltage $V_2-E_{2R}$ is greater than 0 switch 34 is switched to the B position and a logic 1 appears on the output terminal 39. If the voltage $V_2-E_{2R}$ is less than 0 switch 34 remains in position A and a logic 0 appears on output terminal 39.

This process is continued for the next two stages, the signal going through FET 54 being less than reference voltage $E_{4R}$ provided at terminal 56. This signal identified as $V_5$ is coupled to amplifier 60. Amplifier 60 increases the signal either by 10 or 16 times depending on whether BCD or binary outputs are desired.

For an actual voltage example, assuming 7.5 volts analog are applied to input terminal 28 and $E_{1R}$ being 8 volts, $E_{2R}$ being 4 volts, $E_{3R}$ being 2 volts, and $E_{4R}$ being 1 volt, FET switch 24 will be in position A since the output of amplifier 21 is less than 0 ($V_1-E_{1R}=7.5$ volts$-8$ volts$=-0.5$ volts). Switch 34 will be in position B since $V_2-4=7.5-4=3.5$ volts, which is greater than 0 and a positive output from comparator 32 switches FET 34. A logic 1 will appear at the output terminal 39. The output of amplifier 41 is $V_3-2=3.5-2=1.5$ volts which is greater than 0 causing FET 44 to be in position B and a logic 1 to appear at the output terminal 49. The output of amplifier 51 is $V_4-1=1.5-1=0.5$ volts which is greater than 0 causing FET 54 to be in position B and a logic 1 to appear at the output 59. The remainder of 0.5 volts is amplified by amplifier 60 and applied to the next stage of conversion. Thus for the 7.5 volt input, comparators 22, 32, 42 and 52 have logic outputs at terminals 29, 39, 49, and 59 of 0111 which is binary seven.

This circuit of FIG. 1 is for only 1 digit and a display unit can be driven from the binary outputs to indicate the instantaneous value of the analog signal being processed in digital format. For each additional digit desired additional circuits like FIG. 1 are added following amplifier 60. By using quad operational amplifiers, quad comparators and quad FET switches, the analog to digital conversion can be accomplishd with a minimum package count.

Typical components which can provide the respective amplifier and switching functions of the converter include the following shelf items of National Semiconductor Corporation but are not limited thereto.

Operational amplifiers: LM1458
Comparators: LM334
Amplifier 60: LM1458
FET switches: LF11333

Typically, for binary operation the maximum voltage processed by a single, four section circuit as shown is less than 16 volts. Adding one additional stage with proper reference voltages (E ref) per stage would allow a binary readout of less than 32 volts. Similarly reducing the section to three sections would allow processing only signals less than 8 volts analog. For BCD operation the limiter at the input of terminal 28 insures that the initial input analog signal is less than 10 volts.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

I claim:

1. A subtractor analog to digital converter for providing direct conversion of analog signals and comprising: a plurality of analog signal processing sections each having an analog signal input, a digital signal output, and an analog signal output, the input of each of said signal processing sections being adapted for receiving an analog signal input for processing, the digital output being disposed for providing a binary output signal and said analog output being adapted for providing a selectable analog voltage output; said signal processing sections being arranged in sequence such that the input of a first signal processing section is adapted for receiving an externally supplied analog signal to be converted and subsequent sections being disposed sequentially such that the analog output of a preceding section provides the input to a succeeding section, the digital output from each section compositely providing a digital representation of the signal level of the analog input signal coupled to said converter; each of said signal processing sections comprising an operational amplifier having first and second inputs and an output, a comparator amplifier having first and second inputs and an output, and switching means for selectively switching between two input signals; said operational amplifier first input being coupled to receive said analog signal input, said second input being adapted to receive a predetermined reference voltage and said output being coupled as the first input to said comparator, the second input of said comparator being set at a fixed voltage reference for providing a polarity difference comparator output in response to variations between the two comparator input signals thereby providing binary output signals therefrom; said switching means having first, second and third terminals, said first terminal being coupled directly to said analog signal input, said second terminal being coupled to the output of said operational amplifier and said third terminal being coupled as said analog signal output of each of said sections; each of said sections switching means being a field effect transister circuit for selectively switching between the respective section analog signal input and the operational amplifier analog signal output for coupling the operational amplifier analog signal output through said field effect transistor switch when the analog signal input exceeds the predetermined reference voltage input to said operational amplifier second input and simultaneously providing a comparator output signal which is a binary one; said plurality of signal processing sections are grouped into a plurality of signal processing stages, each stage comprising at least four sections; and further comprising means coupled between each of said processing stages for preparing any input analog signal from a preceding stage for processing thereby, said means for preparing comprising an operational amplifier having a first input adapted to receive said analog input signal from a preceding stage, a second input, and an output adapted to provide any residual analog output for processing by a subsequent stage, first and second resistances coupled respectively to said amplifier second input, single pole-double throw switching means coupled between ground, said first resistance and said second resistance for changing the signal applied to the second input of said operational amplifier and thereby changing the amplification of said amplifier on said analog signal input for providing a selectable amplification factor of 10 or 16 to the input analog signal.

* * * * *